(12) United States Patent
Smith

(10) Patent No.: US 7,855,139 B2
(45) Date of Patent: Dec. 21, 2010

(54) SYSTEMS AND METHODS FOR CONTROLLING THE EFFECTIVE DIELECTRIC CONSTANT OF MATERIALS USED IN A SEMICONDUCTOR DEVICE

(75) Inventor: Gregory C. Smith, Austin, TX (US)

(73) Assignee: Sematech, Inc., Austin, TX (US)

( * ) Notice: Subject to any disclaimer, the term of this patent is extended or adjusted under 35 U.S.C. 154(b) by 523 days.

(21) Appl. No.: 11/754,845

(22) Filed: May 29, 2007

(65) Prior Publication Data
US 2008/0299779 A1    Dec. 4, 2008

(51) Int. Cl.
H01L 21/4763    (2006.01)
(52) U.S. Cl. .............. 438/619; 438/421; 438/622; 257/758; 257/E21.581; 257/E23.144
(58) Field of Classification Search ............ 438/638, 438/639, 739, 740, 759, 622, 421, 422, 118, 438/619; 257/758–760, 774, 637, E21.581, 257/E23.144
See application file for complete search history.

(56) References Cited

U.S. PATENT DOCUMENTS

| | | | | |
|---|---|---|---|---|
| 5,641,712 | A * | 6/1997 | Grivna et al. | 438/624 |
| 6,136,687 | A * | 10/2000 | Lee et al. | 438/624 |
| 6,291,030 | B1 * | 9/2001 | Chao et al. | 427/579 |
| 6,303,464 | B1 * | 10/2001 | Gaw et al. | 438/422 |
| 6,309,958 | B1 * | 10/2001 | Okada | 438/624 |
| 6,713,365 | B2 * | 3/2004 | Lin et al. | 438/424 |
| 2001/0051423 | A1 * | 12/2001 | Kim et al. | 438/624 |
| 2002/0014697 | A1 * | 2/2002 | Tamaoka et al. | 257/758 |
| 2003/0068882 | A1 * | 4/2003 | Cheong | 438/639 |
| 2005/0186796 | A1 * | 8/2005 | Lin et al. | 438/688 |
| 2007/0045769 | A1 * | 3/2007 | Bian et al. | 257/510 |
| 2008/0057666 | A1 * | 3/2008 | Kim | 438/422 |

OTHER PUBLICATIONS

Daamen et al., "Air gap integration for the 45nm node and beyond," International Interconnect Technology Conference, p. 240-242, 2005.

Gosset et al. "General review of issues and perspectives for advanced copper interconnections using air gap as ultra-low K material," International Interconnect Technology Conference, p. 65-67, 2003.

Gueneau de Mussy et al., "Novel selective sidewall airgap process," International Interconnect Technology Conference, p. 150-152, 2005.

Noguchi et al., "Misalignment-free air-gap (MFAG) interconnect with via base structure for 45/65nm node and below," International Interconnect Technology Conference, p. 167-169, 2006.

(Continued)

*Primary Examiner*—Matthew C Landau
*Assistant Examiner*—Latanya Crawford
(74) *Attorney, Agent, or Firm*—Fulbright & Jaworski L.L.P.

(57) ABSTRACT

Systems and methods for controlling the effective dielectric constant of materials used in a semiconductor device are shown and described. In one embodiment, a method comprises providing a semiconductor substrate with a plurality of pillars formed thereon, depositing a first layer of dielectric material over a plurality of pillars, removing a portion of the first layer deposited over the plurality of pillars, and depositing a second layer of dielectric material over the plurality of pillars, where the second layer leaves a plurality of voids between the plurality of pillars.

16 Claims, 2 Drawing Sheets

OTHER PUBLICATIONS

Noguchi et al., "Reliability of air-gap Cu interconnect and approach to selective W sealing using 90nm node technology," International Interconnect Technology Conference, p. 81-83, 2004.

Uno et al., "Dual damascene process for air-gapCu interconnects using conventional CVD films as sacrificial layers," International Interconnect Technology Conference, p. 174-176, 2005.

* cited by examiner

SYSTEMS AND METHODS FOR CONTROLLING THE EFFECTIVE DIELECTRIC CONSTANT OF MATERIALS USED IN A SEMICONDUCTOR DEVICE

BACKGROUND OF THE INVENTION

1. Field of the Invention

The present invention relates generally to semiconductor fabrication and, more particularly, to systems and methods for controlling the effective dielectric constant of materials used in a semiconductor device.

2. Description of Related Art

Semiconductor fabrication involves two separate processes. First, devices are created on a wafer surface. Then, those devices are connected to each other using various metal layers in a process called interconnect metallization. One or more layers of dielectric material provide the necessary isolation between metal layers. The dielectric material may be, for example, silicon oxide, silicon nitride, or the like. Once the dielectric is deposited over a metal layer, it is etched in masking step to create vias or plugs, which are openings that expose the underlying metal layer. The vias or plugs are then filled with conductive material.

Although necessary to isolate the various metal layers, dielectric layers present significant challenges to the operation of high-performance circuits. Particularly, the combination of metal resistance and dielectric capacitance slows down the transmission of electric signals within the circuit. Further, dielectric capacitance is directly proportional to the dielectric constant (k) of the material used. Generally speaking, low-k materials are preferable when fabricating faster circuits. However, the inventor hereof has recognized that low-k materials are typically porous, have poor strength characteristics, and are more susceptible to damage, thus compromising their reliability.

These referenced shortcomings are not intended to be exhaustive, but rather are among many recognized by the present inventor that tend to impair the effectiveness of previously known techniques; however, those mentioned here are sufficient to demonstrate that the methodologies appearing in the art have not been satisfactory and that a significant need exists for the techniques described and claimed in this disclosure.

SUMMARY OF THE INVENTION

The present invention provides systems and methods for controlling the effective dielectric constant of materials used in a semiconductor device. In one embodiment, a method comprises providing a semiconductor substrate with a plurality of pillars formed thereon, depositing a first layer of dielectric material over a plurality of pillars, removing a portion of the first layer deposited over the plurality of pillars, and depositing a second layer of dielectric material over the plurality of pillars, where the second layer leaves a plurality of voids between the plurality of pillars.

In another embodiment, a method comprises depositing a first layer of dielectric material over a semiconductor structure, the first layer comprising a top portion having a top thickness deposited on top of each of a plurality of metal lines and a lateral portion having a lateral thickness deposited on sides of each of the plurality of metal lines, removing a lateral amount of dielectric material from the first layer approximately equal to the lateral thickness while leaving a top amount of dielectric material on top of each of the plurality of metal lines, and depositing a second dielectric layer over the semiconductor structure to form a plurality of voids between the plurality of metal lines.

In yet another embodiment, a semiconductor device comprising a layer with reduced effective capacitance is fabricated by a method comprising the steps of: depositing a first layer of dielectric material over a semiconductor structure, where the first layer comprises a top portion having a top thickness deposited on top of each of a plurality of metal lines and a lateral portion having a lateral thickness deposited on sides of each of the plurality of metal lines, removing a lateral amount of dielectric material from the first layer approximately equal to the lateral thickness while leaving a top amount of dielectric material on top of each of the plurality of metal lines, and depositing a second dielectric layer over the semiconductor structure resulting in a plurality of voids between the plurality of metal lines that reduces an effective dielectric constant of the second dielectric layer.

The term "coupled" is defined as connected, although not necessarily directly, and not necessarily mechanically.

The terms "a" and "an" are defined as one or more unless this disclosure explicitly requires otherwise.

The term "substantially," "about," and its variations are defined as being largely but not necessarily wholly what is specified as understood by one of ordinary skill in the art, and in one non-limiting embodiment, the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION OF THE INVENTION

The invention and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present invention provides systems and methods for reducing the effective dielectric constant of materials used in the fabrication of semiconductor devices. For example, a dielectric layer with air or vacuum space between structures such as metal lines may be created. The aspect ratio of an etched air gap structure is increased prior to a main dielectric deposition, for instance, by use of a preliminary dielectric deposition. This preliminary dielectric deposition may be followed by a partial etch back. Resulting dielectric structures have higher void fraction and thus lower effective k value.

Referring now to FIGS. 1-4, steps for reducing the effective dielectric constant of materials used in the fabrication of semiconductor devices are illustrated according to one exemplary embodiment of the present invention. In a first step shown in FIG. 1, semiconductor structure 100 comprising metal lines or pillars 101 is provided. For example, a metal (e.g., copper) may be metallized upon structure 100 using a Damascene interconnect process or the like. Optionally, a dielectric barrier layer (not shown) may be deposited to protect metal lines 101. The dielectric barrier may be a thin silicon carbide layer, or a thin selectively deposited metal layer for preventing prevent metal diffusion into the dielectric to be deposited as described below.

Figure 1:
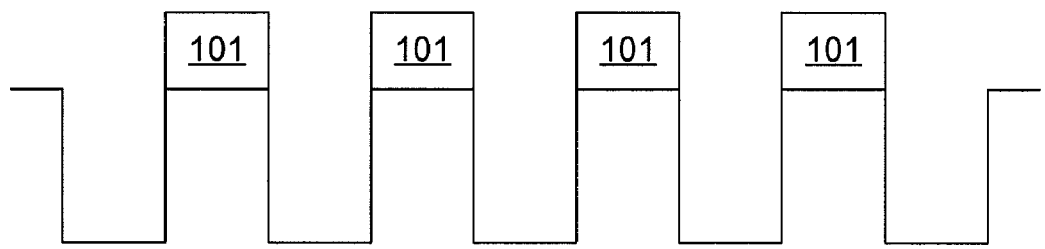
FIGS. 1-4 show cross-section views of a semiconductor device undergoing fabrication steps for reducing the effective dielectric constant of materials used therein, according to one exemplary embodiment of the present invention.
Figure 2:
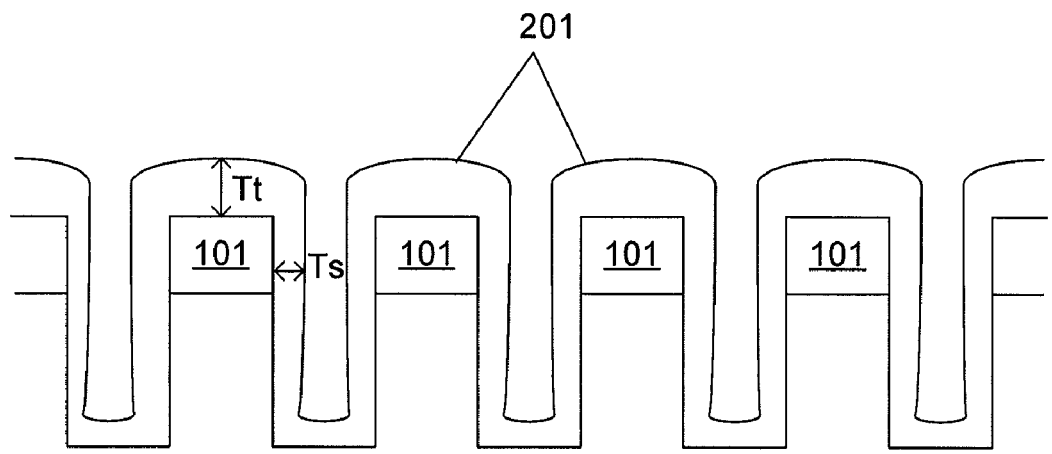

Next, as shown in FIG. 2, a preliminary dielectric layer 201 may be deposited over metal lines 101. Preferably, the preliminary deposition of dielectric layer 201 is such that it maintains gaps between metal lines 101 open. This step may be achieved, for example, by determining the amount of dielectric material that would be sufficient to close the smallest gap between metal lines 101 and depositing less than that amount in a process that is selective to metal lines 101.

In one embodiment, dielectric layer 201 has a top thickness (Tt) greater than its lateral thickness (Ts). To obtain the proper relationship between Tt and Ts, a highly reactive deposition method may be used for the dielectric's deposition. For example, the deposition method may include a plasma enhanced oxide deposition using $SiH_4$ and $N_2O$. This procedure allows the top to lateral thickness ratio to be controlled such that Tt>>Ts (when so desired).

Figure 3:
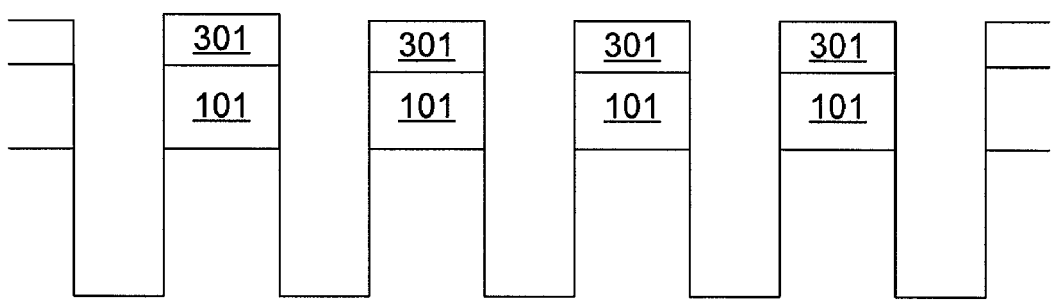
Figure 4:
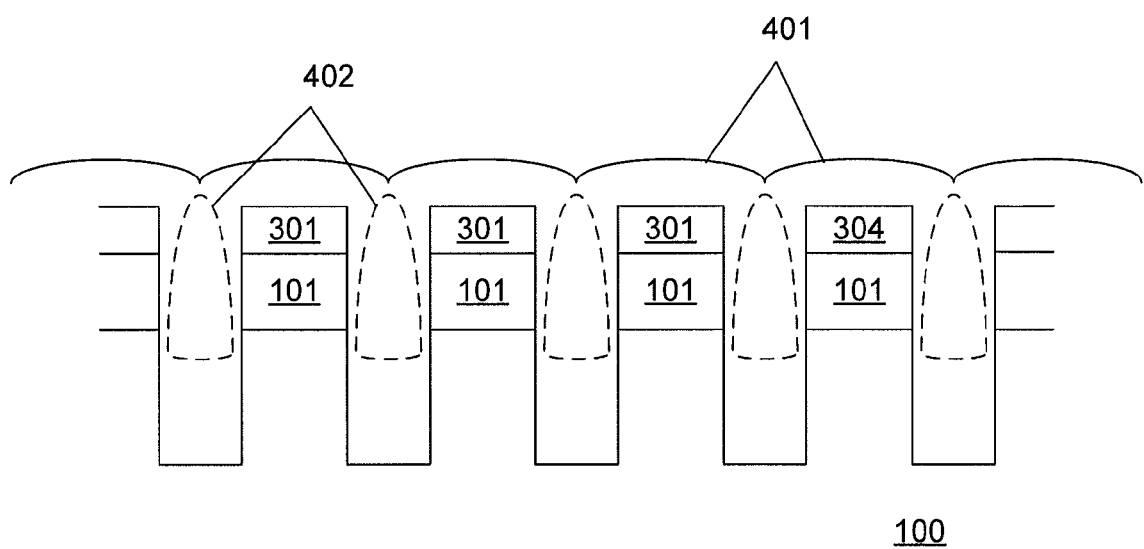

In the step shown in FIG. 3, dielectric material 201 is etched, for example, using an isotropic etch-back process. For instance, a diluted hydrogen fluoride (HF) solution may be used to remove an amount of material equal to $T_s$. As such, this step raises the aspect ratio of the gaps by leaving dielectric material 301 over metal lines 101, thus increasing their relative height. Next, interlayer dielectric layer 401 may be deposited with a transport controlled process purposefully having poor gap fill properties, as shown in FIG. 4. For example, a plasma enhanced chemical vapor deposition (CVD) procedure may be used such that reactants do not have sufficient time to diffuse on the surface before reacting, thus causing a reduced film thickness on the sidewall—i.e., the deposition rate is substantially lower between metal lines 101 as compared with the top of metal lines 101.

In this manner, voids 402 may result within layer 401. The void fraction may determine the dielectric constant of layer 401. In a model where there is no dielectric barrier between the wires and the facing surfaces of metal lines 101 act as parallel plate capacitors, the capacitance per unit length and height of metal lines 101 is given by Equation 1 shown below:

$$C = \frac{\varepsilon_o * k}{w * (VF * ((k-1) + 1))} \quad \text{Equation 1}$$

where $\varepsilon_0$ is the permittivity of free space, VF is the void fraction defined as VF=1−(2*t/w), where t is the thickness of dielectric on each wall of the space, and k is the dielectric constant of the deposited material. Equation 1 has the property that when the void fraction VF is zero, C=Eo*k/w, and when the void fraction VF is 1, C=Eo/w.

In this manner, the capacitance (and thus the speed and performance) of the resulting semiconductor device may be designed by controlling the void fraction and the effective permittivity of the deposited dielectric layer. By increasing the void fraction—i.e., increasing the air or vacuum gap between metal lines 101—the effective dielectric constant of the circuit is lowered. The void fraction may be determined by the ratio of top thickness (Tt) to lateral thickness (Ts) of dielectric layer 201. For example, the ratio of Tt to Ts may be increased to result in larger voids 402 and lower effective dielectric constant.

The systems and methods described herein provide numerous advantages over the prior art. For example, using the systems and methods outlined herein, dielectric materials with high nominal k values may be used in the fabrication of high-performance devices by lowering their effective k value during fabrication. This avoids the need to use materials with low nominal k values, which are more susceptible to damage and compromise device reliability and performance. Furthermore, the steps illustrated in FIGS. 1-4 do not require additional lithography steps, thus reducing fabrication requirements and resulting in substantial cost savings.

All of the methods disclosed and claimed herein can be executed without undue experimentation in light of the present disclosure. While the methods of this disclosure may have been described in terms of preferred embodiments, it will be apparent to those of ordinary skill in the art that variations may be applied to the methods and in the steps or in the sequence of steps of the method described herein without departing from the concept, spirit and scope of the disclosure. All such similar substitutes and modifications apparent to those skilled in the art are deemed to be within the spirit, scope, and concept of the disclosure as defined by the appended claims.

The invention claimed is:
1. A method comprising:
providing a semiconductor substrate with a plurality of pillars formed thereon;
depositing a first layer of dielectric material over a plurality of pillars;
removing a portion of the first layer deposited over the plurality of pillars;
depositing a second layer of dielectric material over the plurality of pillars, where the second layer leaves a plurality of voids between the plurality of pillars;
controlling the deposition of the first layer such that an amount of dielectric material deposited on top of each of the plurality of pillars is greater than an amount of dielectric material deposited on sides of each of the plurality of pillars;

controlling the removal of the portion of the first layer such that an amount of dielectric material remains on top of each of the plurality of pillars; and controlling the removal of the portion of the first layer such that an amount of dielectric material is substantially absent from the sides of each of the plurality of pillars.

2. The method of claim 1, where the size of a void is a function of a ratio between an amount of dielectric material deposited on top of each of the plurality of pillars and an amount of dielectric material deposited on sides of each of the plurality of pillars.

3. The method of claim 1, where the size of each of the plurality of voids is directly proportional to the height of the plurality of pillars upon removal of the portion of the first layer.

4. The method of claim 1, further comprising controlling the deposition of the first layer to increase a number of the plurality of voids.

5. The method of claim 1, further comprising controlling the removal of the portion of the first layer to increase the size of each of the plurality of voids.

6. A method comprising:

depositing a first layer of dielectric material over a semiconductor structure, the first layer comprising a top portion having a top thickness deposited on top of each of a plurality of metal lines and a lateral portion having a lateral thickness deposited on sides of each of the plurality of metal lines;

removing a lateral amount of dielectric material from the first layer approximately equal to the lateral thickness while leaving a top amount of dielectric material on top of each of the plurality of metal lines; and depositing a second dielectric layer over the semiconductor structure to form a plurality of voids between the plurality of metal lines.

7. The method of claim 6, further comprising depositing the first layer such that the top thickness is greater than the lateral thickness.

8. The method of claim 6, further comprising controlling at least one of: the size of the plurality of voids, and the number of voids; by controlling at least one of: the deposition of the first layer, and the removal of the lateral amount.

9. The method of claim 7, where depositing the first layer comprises performing a plasma-enhanced oxide deposition.

10. The method of claim 8, further comprising increasing a number of the plurality of voids by increasing a ratio of top to lateral thickness.

11. The method of claim 8, further comprising increasing the size of each of the plurality of voids by increasing a ratio of top to lateral thickness.

12. A semiconductor device comprising a layer with reduced effective capacitance, the device being fabricated by a method comprising the steps of claim 6.

13. The semiconductor device of claim 12, further comprising depositing the first layer such that the top thickness is greater than the lateral thickness.

14. The semiconductor device of claim 12, further comprising controlling the size of each of the plurality of voids by controlling the deposition of the first layer.

15. The semiconductor device of claim 12, further comprising reducing the effective dielectric constant of the second dielectric layer by increasing a number of the plurality of voids.

16. The semiconductor device of claim 12, further comprising reducing the effective dielectric constant of the second dielectric layer by increasing a ratio of top to lateral thickness.

* * * * *